United States Patent
Hsu et al.

(10) Patent No.: US 10,529,438 B2
(45) Date of Patent: Jan. 7, 2020

(54) DRAM AND METHOD OF DESIGNING THE SAME

(71) Applicant: NANYA TECHNOLOGY CORPORATION, New Taipei (TW)

(72) Inventors: Ting-Shuo Hsu, New Taipei (TW); Chih-Wei Shen, Dounan Township, Yunlin County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 3 days.

(21) Appl. No.: 15/955,076

(22) Filed: Apr. 17, 2018

(65) Prior Publication Data
US 2019/0318800 A1    Oct. 17, 2019

(51) Int. Cl.
*G11C 29/48*    (2006.01)

(52) U.S. Cl.
CPC .................................. *G11C 29/48* (2013.01)

(58) Field of Classification Search
CPC ........................................................ G11C 29/48
USPC ........................................... 365/201; 714/718
See application file for complete search history.

(56) References Cited

U.S. PATENT DOCUMENTS

| 6,601,197 B1 * | 7/2003 | Naritake | G11C 29/48 |
| | | | 714/718 |
| 7,254,087 B2 | 8/2007 | Kim et al. | |

* cited by examiner

*Primary Examiner* — Jason Lappas
(74) *Attorney, Agent, or Firm* — Muncy, Geissler, Olds & Lowe, P.C.

(57) ABSTRACT

The present disclosure provides a dynamic random access device (DRAM). The DRAM includes a first node, a second node and a pad. The first node is configured to conduct a first internal signal generated by internal devices of the DRAM. The second node is configured to conduct a second internal signal generated by other internal devices of the DRAM. The pad is configured to receive one of the first internal signal and the second internal signal.

13 Claims, 8 Drawing Sheets and a method of designing the same, and
DRAM AND METHOD OF DESIGNING THE SAME

TECHNICAL FIELD

The present disclosure relates to a dynamic random access memory (DRAM) and a method of designing the same, and more particularly, to a DRAM having a plurality of internal signals.

DISCUSSION OF THE BACKGROUND

Dynamic random access memory (DRAM) is a type of random m access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic HIGH and a logic LOW, two bit lines (BLs) are typically used for each bit, wherein the first bit line in the bit line pair is known as a bit line true (BLT) and the other bit line in the bit line pair is the bit line complement (BLC). The single NMOS transistor's gate is controlled by a word line (WL).

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a dynamic random access memory. The DRAM includes a first node, a second node and a pad. The first node is configured to conduct a first internal m signal generated by internal devices of the DRAM. The second node is configured to conduct a second internal signal generated by other internal devices of the DRAM. The pad is configured to receive one of the first internal signal and the second internal signal.

In some embodiments, the DRAM further comprises a first switch and a second switch. The first switch is coupled between the first node and the pad. The second switch is coupled between the second node and the pad. Either the first switch couples the first node to the pad, or the second switch couples the second node to the pad.

In some embodiments, the first switch has the same circuit structure as the second switch.

In some embodiments, the first switch has the same component parameters as the second switch.

In some embodiments, the DRAM is free of a micro pad.

In some embodiments, the second internal signal at the second node would otherwise be eligible for being tested by a probe only if a passivation layer of the DRAM were destroyed.

In some embodiments, the DRAM further comprises a third node. The third node is configured to conduct a third internal signal, generated by another internal device of the DRAM, and is not connected to the pad.

In some embodiments, the DRAM further comprises a switch. The switch is configured to connect either the first device or the second device to the pad.

In some embodiments, the DRAM further comprises a third node. A third internal signal generated by another internal device of m the DRAM exists at the third node.

Another aspect of the present disclosure provides a method of designing a dynamic random access memory (DRAM). The method comprises: providing a first node, which is configured for conducting a first internal signal; providing a second node, which is configured for conducting a second internal signal; and providing a pad, which is configured for receiving one of the first internal signal and the second internal signal.

In some embodiments, the method further comprises: providing a first switch coupled between the first node and the pad; and providing a second switch coupled between the second node and the pad, wherein either the first switch couples the first node to the pad, or the second switch couples the second node to the pad.

In some embodiments, the method does not include providing a micro pad.

In some embodiments, the method further comprises: providing a third node, which is configured for conducting a third internal signal generated by another internal device of the DRAM, and is not connected to the pad.

In some embodiments, the method further comprises: providing a switch, configured for connecting either the first device or the second device to the pad.

In some embodiments, the method further comprises: providing a third node, which is configured for conducting a third internal signal generated by another internal device of the DRAM.

Another aspect of the present disclosure provides a method of testing a dynamic random access memory (DRAM). The method m comprises: connecting one of a first node and a second node to a pad, wherein the first node conducts a first internal signal generated by internal devices of the DRAM, and wherein the second node conducts a second internal signal generated by other internal devices of the DRAM; and testing the one of the first internal signal and the second internal signal by contacting the pad with a probe.

In some embodiments, the operation of connecting one of a first node and a second node to a pad is performed by conducting one of a first switch and a second switch and not conducting the other one of the first switch and the second switch.

In some embodiments, the operation of connecting one of a first node and a second node to a pad is performed by changing a conducted state of a switch, wherein one end of the switch is connected to the pad, and the other end of the switch is connected to the one of the first node and the second node.

In some embodiments, the method further comprises: connecting the other one of the first node and the second node to the pad after connecting the one of the first node and the second node to the pad.

In the present disclosure, a quantity of pads is less than a quantity of internal signals, and according to the arrangement of the first switch and the second switch, the first internal signal and the second internal signal share one pad. As a result, a workstation is able to analyze both a relatively critical internal signal and a relatively not critical internal signal. Therefore, if the DRAM functions abnormally, the cause can be found and addressed relatively easily.

Moreover, since one pad is able to receive many internal m signals, instead of only a single internal signal, there is no need to prepare a micro pad. As a result, a design of the DRAM is relatively simple.

In contrast to existing methods, in which the second internal signal at the second node is eligible for testing by the probe only if a passivation layer of the DRAM is destroyed, and in which the second internal signal at the second node is subsequently also tested by the exposed micro pad, under embodiments of the present disclosure, the second internal signal at the second node can be tested without destroying the passivation layer of the DRAM. As a result, the testing of the DRAM is relatively simple.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The m disclosure should also be understood to be connected to the figures' reference numbers, which refer to similar elements throughout the description.

DETAILED DESCRIPTION

Figure 1:
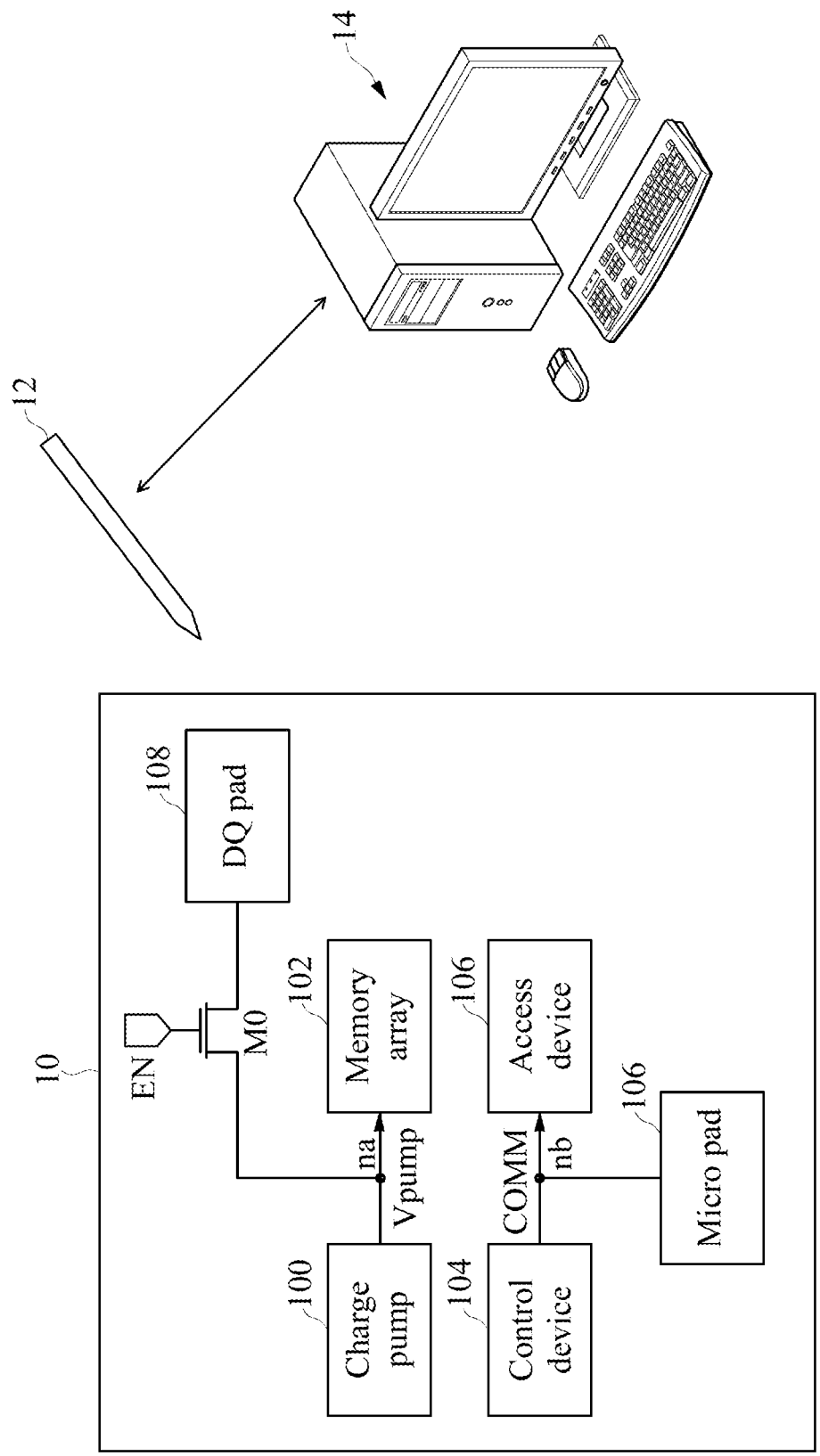
FIG. 1 is a schematic diagram illustrating testing of a comparative dynamic random access memory (DRAM).

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram illustrating testing of a comparative dynamic random access memory (DRAM) 10. Referring to FIG. 1, the DRAM 10 is tested by a workstation 14 via a probe 12. The workstation 14 analyzes signals from the probe 12, thereby determining performance of the DRAM 10.

In further detail, the DRAM 10 includes a charge pump 100, a memory array 102, a control device 104 and an access device 106.

The charge pump 100, operating in a voltage domain, functions to provide a pump voltage Vpump as a supply voltage of devices, in particular, of the memory array 102, wherein the pump voltage Vpump is deemed as an internal signal since the pump voltage Vpump is generated by the charge pump 100 (i.e., an internal device of the DRAM 10). In FIG. 1, only one block representing the charge pump 100 is depicted. However, one block may represent a plurality of charge pumps, each of which provides different voltage levels of pump voltages to the memory array 102 and/or other devices in the DRAM 10.

The memory array 102 includes a plurality of memory cells (not depicted) arranged in a two-dimensional array. The memory cell functions to store data. In addition to the memory cells, the memory array 102 further includes a plurality of word lines and a plurality of bit lines. The word lines and the bit lines are used to control operation of the associated memory cells.

The access device 106 functions to access the memory array 102 in response to a command COMM from the control device 104, wherein the command COMM is deemed as an internal signal generated by the control device 104 (i.e., an internal device of the DRAM 10). The command COMM includes commands such as a read command, a write command, a burst read command, or a burst write command. Based on the type of command indicated by the command COMM, the access device 106 performs a corresponding operation.

The control device 104 functions to control the charge pump 100, the memory array 102 or the access device 106. In some embodiments, the control device 104 includes combinational logic.

Generally, in a foundry, it is necessary to test whether a DRAM functions normally, or to test whether a function performed by the DRAM satisfies a performance requirement stated in a specification. If the DRAM fails, or if the function performed does not satisfy the specification, it is necessary to find the cause of the failure. One possible way to find the cause is to test an internal signal of the DRAM using a probe to contact a DQ pad receiving the internal signal. However, a quantity of the DQ pads is limited. It may not be possible to provide a DQ pad for each of the internal signals. Consequently, some internal signals considered to be relatively not critical are not provided with a DQ pad.

As shown in FIG. 1, in the comparative DRAM 10, there are two internal signals, the pump voltage Vpump and the command COMM. However, there is only one DQ pad 108. A quantity of DQ pads is less than a quantity of internal signals. The command COMM is considered to be relatively not critical, and therefore is not provided with a DQ pad.

A node na conducts the pump voltage Vpump. The DQ pad 108 is coupled to the node na via a transistor M0.

During operation of a testing mode, the transistor M0 is conducted, and the pump voltage Vpump at the node na is transmitted through the DQ pad 108 via the probe 12 back to the workstation 14.

In some circumstances, although the analysis result shows that the pump voltage Vpump is normal and satisfies the expected value, the DRAM 10 still functions abnormally. For example, the DRAM 10 is requested to perform a read operation, but does not do so.

One possible cause of the failure is that the control device 104 does not issue a command COMM of a read operation when the DRAM 10 is requested to perform the read operation. Moreover, as previously mentioned, the command COMM is considered to be relatively not critical and therefore is not provided with a DQ pad. In the comparative DRAM 10, a micro pad 110 is provided. The micro pad 110 is coupled to a node nb, at which the command COMM exists. Consequently, if the probe 10 is able to contact the micro pad 110, the command COMM is able to be transmitted back to the workstation 14.

As is known to those skilled in the art, typically, a micro pad is covered by a passivation layer. It is necessary to destroy a physical structure of a DRAM in order to destroy the passivation layer such that the micro pad is exposed to a probe. Because such destruction is irreversible, the DRAM is no longer usable.

In some circumstances, an internal signal considered to be relatively not critical is provided with neither a DQ pad nor a micro pad. In such case, if a DRAM functions abnormally, due to such internal signal, such cause may not be found, or may be found only at great expense.

The issues discussed above result from the quantity of DQ pads being less than the quantity of internal signals; such issues can be resolved in accordance with some embodiments of the present disclosure.

It should be noted that the charge pump 100, the memory array 102, the control device 104 and the access device 106 serve only as example components, and the issues discussed above may be encountered by any devices in a DRAM.

Figure 2:
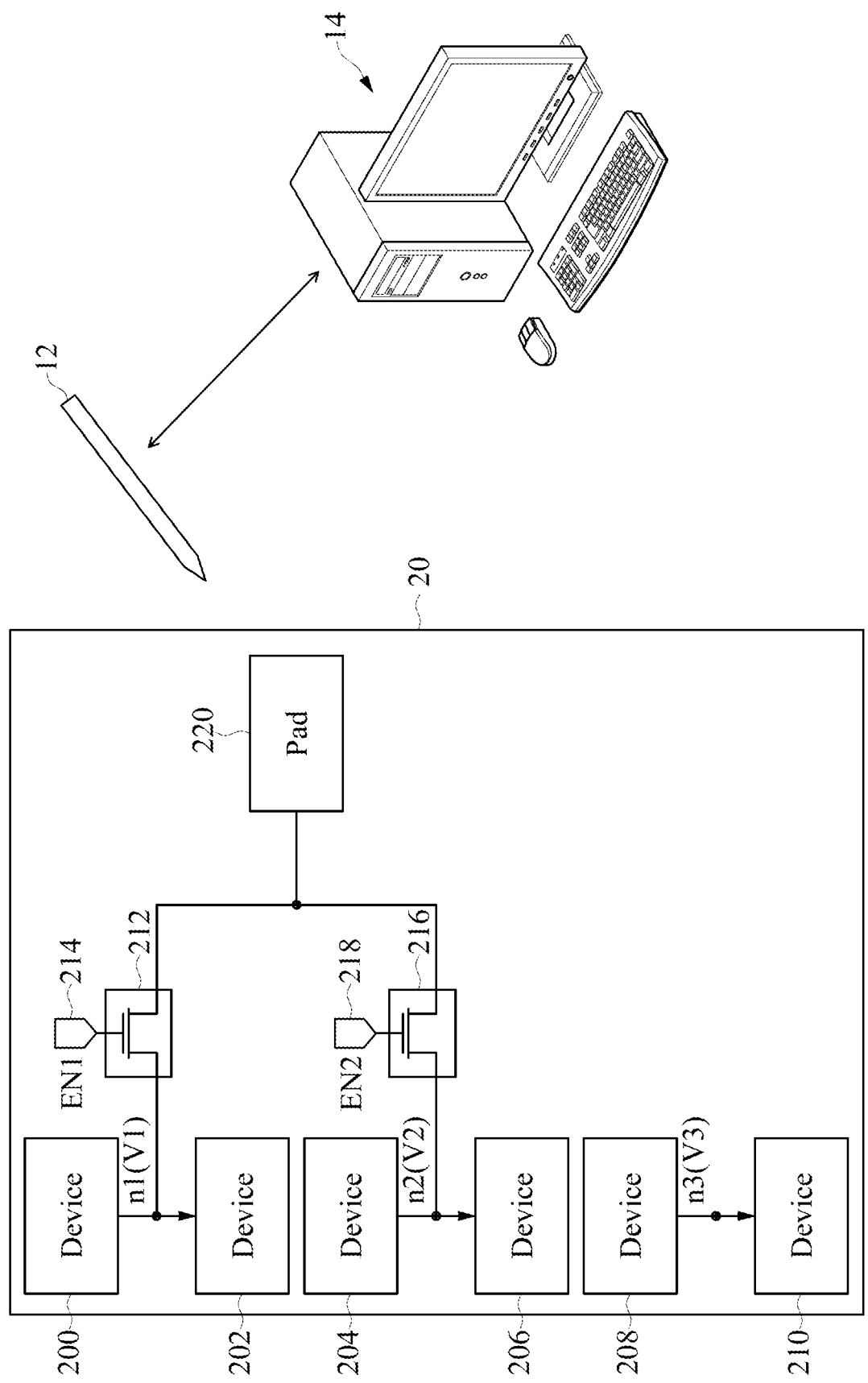
FIG. 2 is a schematic diagram illustrating testing of a dynamic random access memory (DRAM), in accordance with some embodiments of the present disclosure.

FIG. 2 is a schematic diagram illustrating testing of a dynamic random access memory (DRAM) 20, in accordance with some embodiments of the present disclosure. Referring to FIG. 2, the testing of the DRAM 20 is similar to the testing of the DRAM 10. Therefore, detailed descriptions are omitted herein.

The DRAM 20 includes devices 200, 202, 204, 206, 208 and 210, a first switch 212 and a second switch 216, inputs 214 and 218, and a pad 220.

Each of the devices 200, 202, 204, 206, 208 and 210 functions to generate an internal signal. For example, interaction between the devices 200 and 202 is similar to interaction between the charge pump 100 and the memory array 102 described and illustrated with reference to FIG. 1, interaction between the control device 104 and the access device 106 described and illustrated with reference to FIG. 1, and interaction between any two devices in the DRAM 20. For convenience of discussion, a first node n1 refers to a node that is functions to conduct a first internal signal V1 generated by internal devices, for example, the device 200, of the DRAM. A second node n2 refers to a node that is functions to conduct a second internal signal V2 generated by other internal devices, for example, the device 204, of the DRAM. A third node n3 refers to a node that is functions to conduct a third internal signal V3 generated by internal devices, for example, the device 208, of the DRAM, wherein the third node n3 is not connected to the pad 220.

A pad 220 functions to receive one of the first internal signal V1 and the second internal signal V2. In some embodiments, the pad 220 includes a DQ pad. In some embodiments, the DRAM 20 includes a micro pad, as illustrated in FIG. 1. The third node n3 is coupled to the micro pad, and the third node n3 is similar to the node nb described and illustrated with reference to FIG. 1.

The first switch 212, coupled between the first node n1 and the pad 220, functions to connect the first node n1 to the pad 220 in response to an enable signal EN1 from the input 214. In some embodiments, the first switch 212 includes a transistor.

The second switch 216, coupled between the second node n2 and the pad 220, functions to connect the second node n2 to the pad 220 in response to an enable signal EN2 from the input 218. In some embodiments, the second switch 216 includes a transistor.

In some embodiments, the second switch 216 has the same circuit structure as the first switch 212. As a result, a circuit design of the DRAM 20 is relatively simple since the circuit structure of the second switch 216 is able to be duplicated from the circuit structure of the first switch 212.

In some embodiments, the first switch 212 has the same circuit structure as the second switch 216, and the first switch 212 has the same component parameters as the second switch 216. For reasons similar to those discussed above, a circuit design of the DRAM 20 is relatively simple.

In the embodiment shown in FIG. 2, a quantity of pads (i.e., the pad 220) is less than a quantity of internal signals (i.e., the first internal signal V1 and the second internal signal V2). Generally, with the advancement of semiconductor process techniques, a quantity of internal signals increases. However, in the present disclosure, according to the arrangement of the first switch 212 and the second switch 214, the first internal signal V1 and the second internal signal V2 share one pad 220. As a result, a workstation 14 is able to analyze both a relatively critical internal signal and a relatively not critical internal signal (for example, the second internal signal V2 analogous to the command COMM described and illustrated with reference to FIG. 1).

Therefore, if the DRAM 20 functions abnormally, the cause can be found and addressed relatively easily.

It should be noted that, since one pad 220 is able to receive many internal signals, instead of only a single internal signal, it is not necessary to prepare a micro pad, as discussed in FIG. 1. In short, the DRAM 20 is free of a micro pad. As a result, a design of the DRAM 20 is relatively simple.

In contrast to existing methods, in which the second internal signal V2 (analogous to the command COMM described and illustrated with reference to FIG. 1) at the second node n2 is eligible to be tested by the probe 12 only if a passivation layer of the DRAM 20 is destroyed, and in which the second internal signal V2 at the second node n2 is subsequently also tested by the exposed micro pad, under embodiments of the present disclosure, the second internal signal V2 at the second node n2 can be tested without destroying the passivation layer of the DRAM 20. As a result, the testing of the DRAM 20 is relatively simple.

In some embodiments, after one of the first node n1 and the second node n2 is connected to the pad 220, the other one of the first node n1 and the second node n2 is connected to the pad 220. That is, internal signals are tested one by one. As a result, information on performance of the DRAM 20 under different internal voltages is relatively sufficient.

Figure 3:
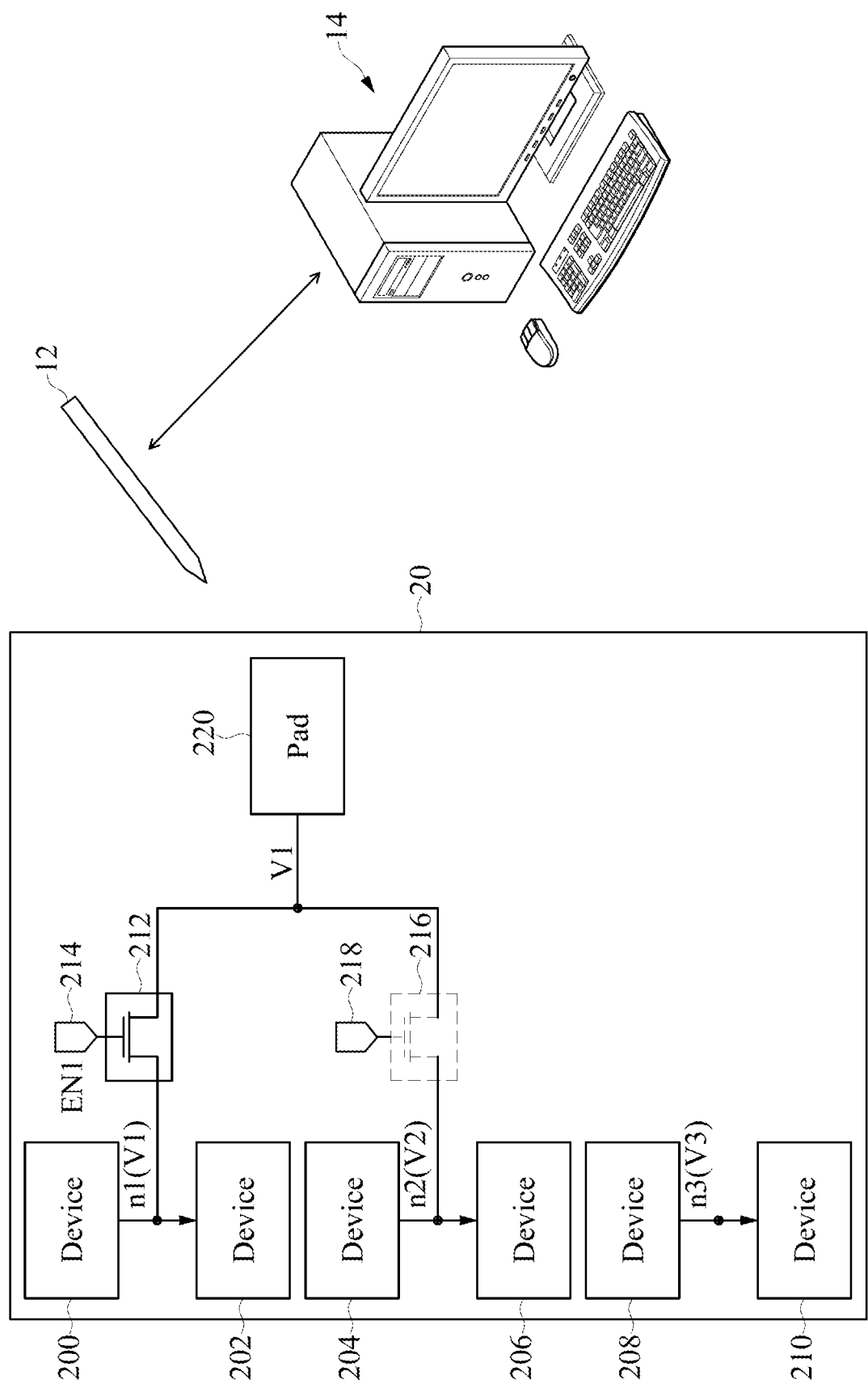
FIG. 3 is a schematic diagram illustrating an operation of the testing of the DRAM shown in FIG. 2, in accordance with some embodiments of the present disclosure.

FIG. 3 is a schematic diagram illustrating an operation of the testing of the DRAM 20 shown in FIG. 2, in accordance with some embodiments of the present disclosure. Referring to FIG. 3, the first switch 212 connects the first node n1 to the pad 220 in response to the enable signal EN1. The pad 220 receives the first internal signal V1. Consequently, the workstation 14 is able to analyze performance of the DRAM 20 under the first internal signal V1.

Figure 4:
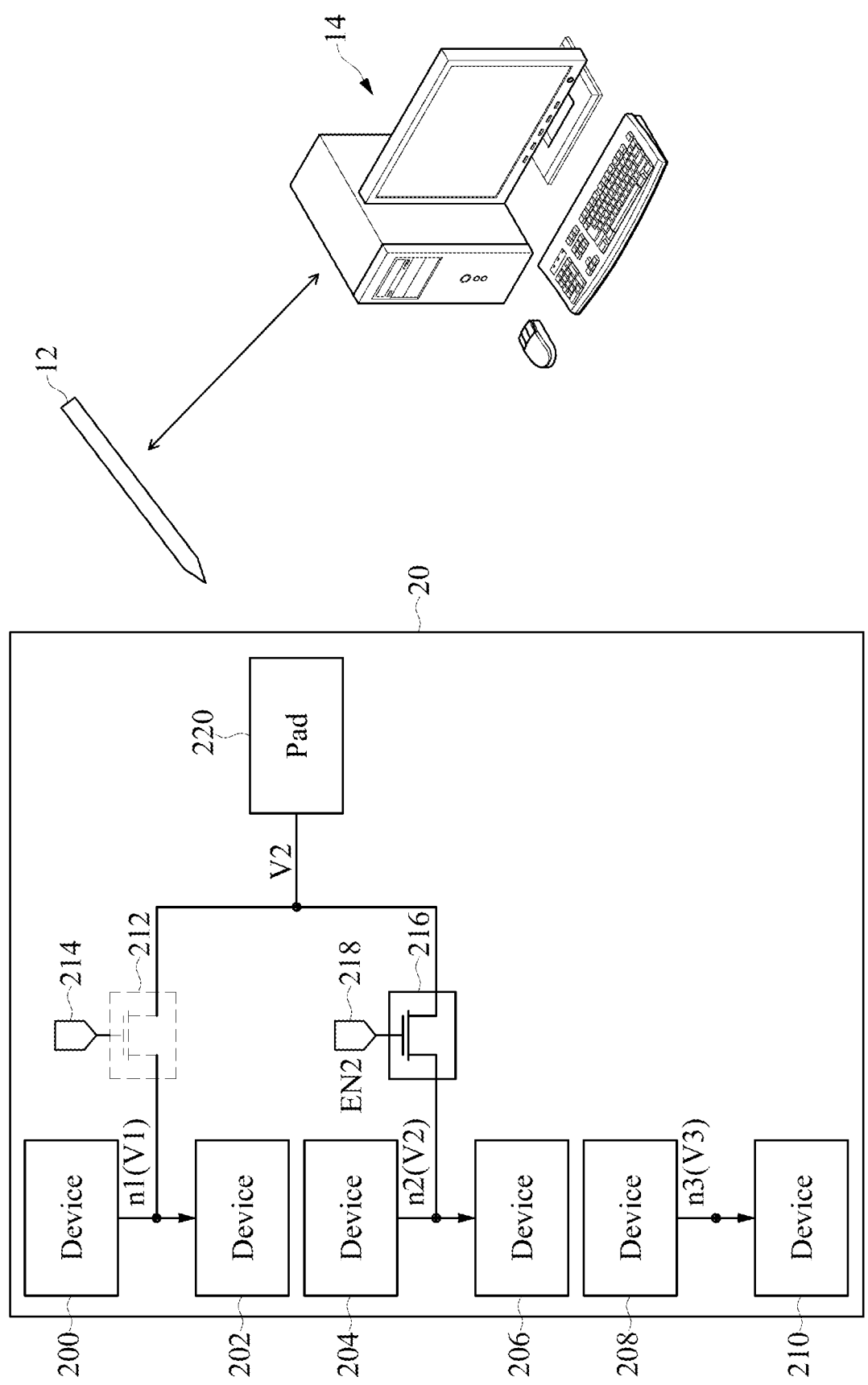
FIG. 4 is a schematic diagram illustrating another operation of the testing of the DRAM shown in FIG. 2, in accordance with some embodiments of the present disclosure.

FIG. 4 is a schematic diagram illustrating another operation of the testing of the DRAM 20 shown in FIG. 2, in accordance with some embodiments of the present disclosure. Referring to FIG. 4, the second switch 216 connects the second node n2 to the pad 220 in response to the enable signal EN2. The pad 220 receives the second internal signal V2. Consequently, the workstation 14 is able to analyze performance of the DRAM 20 under the second internal signal V2.

Figure 5:
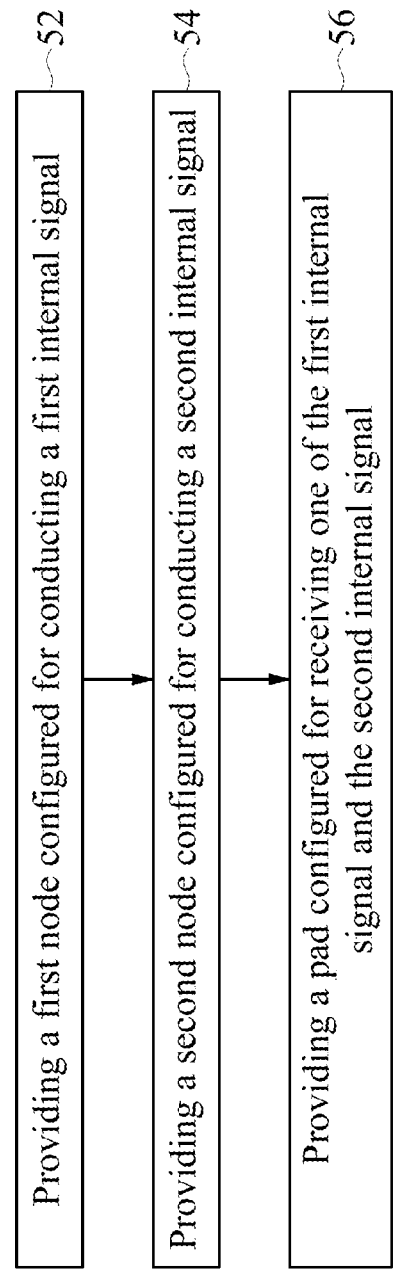
FIG. 5 is a flow chart illustrating a method of designing a DRAM, in accordance with some embodiments of the present disclosure.

FIG. 5 is a flow chart illustrating a method 50 of designing a DRAM, in accordance with some embodiments of the present disclosure. Referring to FIG. 5, the method 50 includes operations 52, 54 and 56.

The method 50 begins with operation 52, in which a first node, which is configured for conducting a first internal signal, is provided.

The method 50 continues with operation 54, in which a second node, which is configured for conducting a second internal signal, is provided.

The method 50 proceeds to operation 56, in which a pad, which is configured for receiving one of the first internal signal and the second internal signal is provided.

The method 50 is merely an example, and is not intended to limit the present disclosure beyond what is explicitly recited in the claims. Additional operations can be provided before, during, and after the method 50, and some operations described can be replaced, eliminated, or moved around for additional embodiments of the method.

Figure 6:
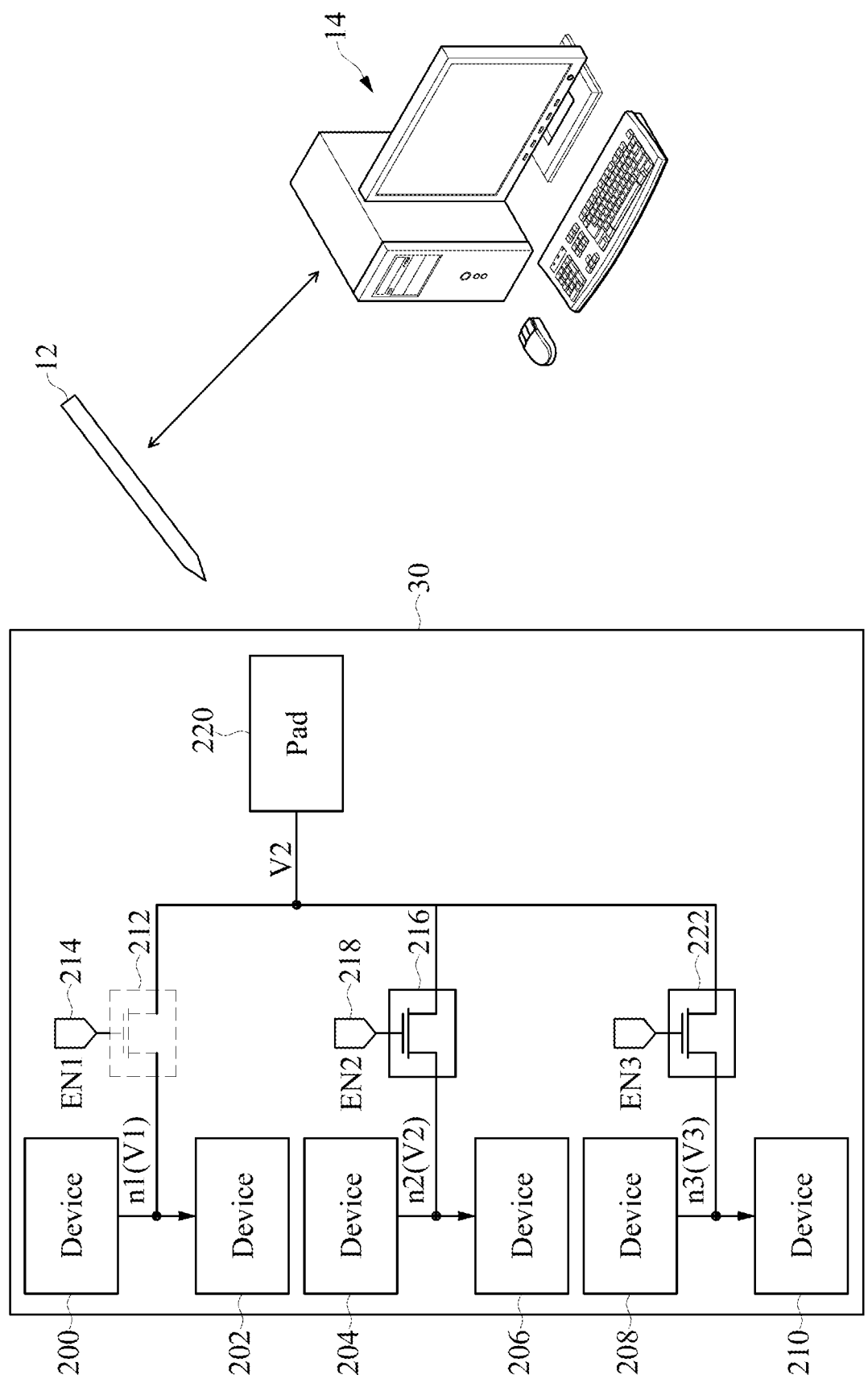
FIG. 6 is a schematic diagram illustrating testing of another dynamic random access memory (DRAM), in accordance with some embodiments of the present disclosure.

FIG. 6 is a schematic diagram illustrating testing of another dynamic random access memory (DRAM) 30, in accordance with some embodiments of the present disclosure. Referring to FIG. 6, the DRAM 30 is similar to the DRAM 20 described and illustrated with reference to FIG. 2 except that, for example, the DRAM 30 further includes a third switch 222. The third switch 222 functions to connect the third node n3 to the pad 220 in response to an enable signal EN3. In some embodiments, the third switch 222 includes a transistor.

In the present embodiment, each of internal signals is connected to the pad 220. Therefore, if the DRAM 30 functions abnormally, the cause can be found and addressed relatively easily.

Figure 7:
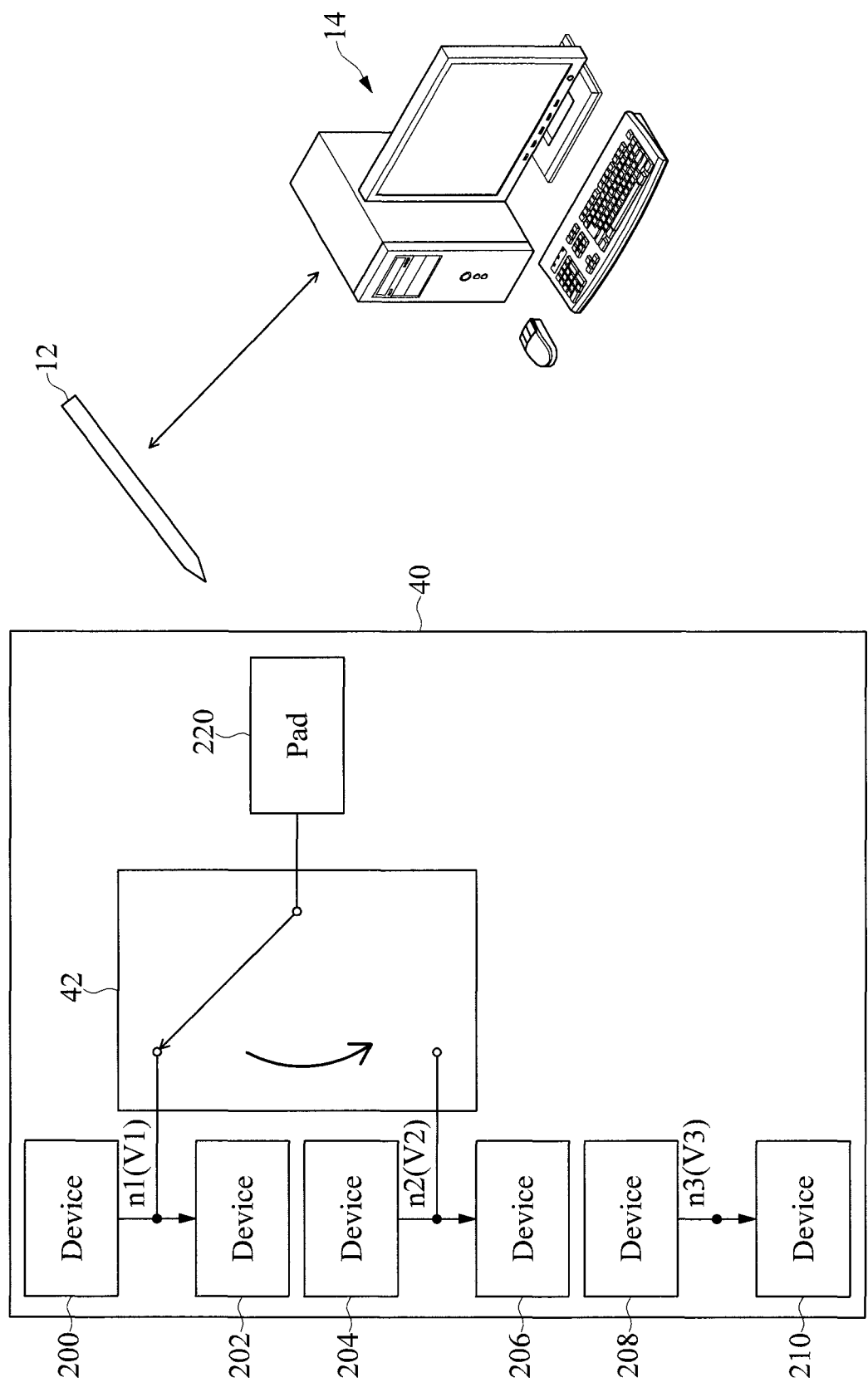
FIG. 7 is a schematic diagram illustrating testing of still another dynamic random access memory (DRAM), in accordance with some embodiments of the present disclosure.

FIG. 7 is a schematic diagram illustrating testing of still another dynamic random access memory (DRAM) 40, in accordance with some embodiments of the present disclosure. Referring to FIG. 7, the DRAM 40 is similar to the DRAM 20 described and illustrated with reference to FIG. 2 except that, for example, the DRAM includes a switch 42. One end of the switch 42 is connected to the pad, and the other end of the switch 42 switches between the first node n1 and the second node n2, depending on which internal signal is requested to be tested.

Figure 8:
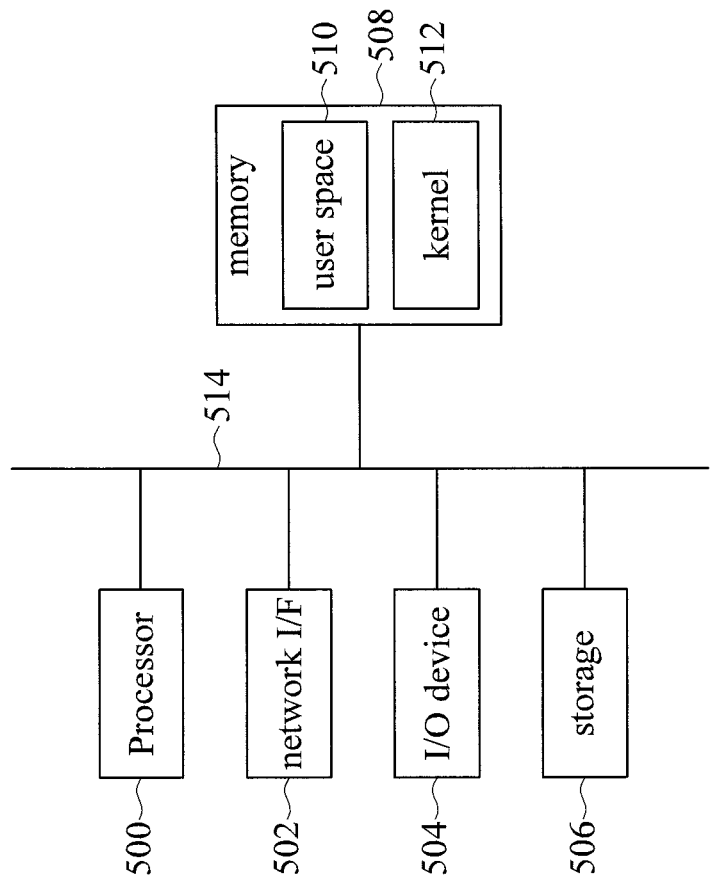
FIG. 8 is a block diagram of the workstation of FIG. 2, in accordance with some embodiments of the present disclosure.

FIG. 8 is a block diagram of the workstation 14 of FIG. 2, in accordance with some embodiments of the present disclosure. One or more of the tools, systems, or operations described with respect to FIGS. 1 to 7 are realized in some embodiments by one or more computer systems of the workstation 14 of FIG. 8. The computer systems comprise a processor 500, a memory 508, a network interface (I/F) 502, a storage 506, and an input/output (I/O) device 504 communicatively coupled via a bus 514 or other interconnection communication mechanism.

The memory 508 comprises, in some embodiments, a random access memory (RAM), other dynamic storage device, read-only memory (ROM), or other static storage device, coupled to the bus 514 for storing data or instructions to be executed by the processor 500, wherein the data or instructions comprise, for example, a kernel 512, user space 510, portions of the kernel or the user space, or components thereof. The memory 508 is also used, in some embodiments, for storing temporary variables or other intermediate information during execution of instructions to be executed by the processor 500.

In some embodiments, the storage 506, such as a magnetic disk or optical disk, is coupled to the bus 514 for storing data or instructions, e.g., a kernel 512, user space 510, etc. The I/O device 504 comprises an input device, an output device, or a combined input/output device for enabling user interaction with the computer system. An input device comprises, for example, a keyboard, keypad, mouse, trackball, trackpad, or cursor direction keys for communicating information and commands to the processor 500. An output device comprises, for example, a display, a printer, a voice synthesizer, etc. for communicating information to a user.

In some embodiments, one or more operations or functions of the tools or systems described with respect to FIGS. 1 to 7 are realized by the processor 500, which is programmed for performing such operations and providing such functionality. One or more of the memory 508, the I/F 502, the storage 506, the I/O device 504, the hardware components, and the bus 514 are operable to receive instructions, data, design rules, netlists, layouts, models and other parameters for processing by the processor 500.

In some embodiments, one or more of the operations, functions of the tools, and systems described with respect to FIGS. 1 to 7 are implemented by specifically configured hardware (e.g., by one or more application specific integrated circuits (ASICs) which are included) separate from or instead of the processor 500. Some embodiments incorporate more than one of the described operations or functions in a single ASIC.

In some embodiments, the operations and functions are realized as functions of a program stored in a non-transitory computer readable recording medium. Examples of a non-transitory computer readable recording medium include, but are not limited to, an external/removable or internal/built-in storage or memory unit, e.g., one or more of an optical disk, such as a DVD, a magnetic disk, such as a hard disk, a semiconductor memory, such as a ROM, a RAM, a memory card, and the like.

In the present disclosure, a quantity of pads is less than a quantity of internal signals, and according to the arrangement of the first switch 214 and the second switch 218, the first internal signal V1 and the second internal signal V2 share one pad 220. As a result, a workstation is able to analyze both a relatively critical internal signal and a relatively not critical internal signal. Therefore, if the DRAM 20 functions abnormally, the cause can be found and addressed relatively easily.

Moreover, since one pad 220 is able to receive many internal signals, instead of only a single internal signal, there is no need to prepare a micro pad. As a result, a design of the DRAM 20 is relatively simple.

In contrast to existing methods, in which the second internal signal V2 at the second node n2 is eligible to be tested by the probe 12 only if a passivation layer of the DRAM 20 is destroyed, and in which the second internal signal V2 at the second node n2 is subsequently also tested by the exposed micro pad, under embodiments of the present disclosure, the second internal signal V2 at the second node n2 can be tested without destroying the passivation layer of the DRAM 20. As a result, the testing of the DRAM 20 is relatively simple.

One aspect of the present disclosure provides a dynamic random access memory. The DRAM includes a first node, a second node and a pad. The first node is configured to conduct a first internal signal generated by internal devices of the DRAM. The second node is configured to conduct a second internal signal generated by other internal devices of the DRAM. The pad is configured to receive one of the first internal signal and the second internal signal.

Another aspect of the present disclosure provides a method of designing a dynamic random access memory (DRAM). The method comprises: providing a first node, which is configured for conducting a first internal signal; providing a second node, which is configured for conducting a second internal signal; and providing a pad, which is configured for receiving one of the first internal signal and the second internal signal.

Another aspect of the present disclosure provides a method of testing a dynamic random access memory (DRAM). The method comprises: connecting one of a first node and a second node to a pad, wherein the first node is configured to conduct a first internal signal generated by internal devices of the DRAM, and wherein the second node is configured to conduct a second internal signal generated by other internal devices of the DRAM; and testing the one of the first internal signal and the second internal signal by contacting the pad with a probe.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, m presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM) which is tested by a workstation via a probe, the DRAM comprising:
   a first node configured to conduct a first internal signal generated by internal devices of the DRAM;
   a second node configured to conduct a second internal signal generated by other internal devices of the DRAM;
   a pad configured to receive one of the first internal signal and the second internal signal, wherein the probe contacts the pad during the DRAM is tested; and
   at least one switch configured to connect either the first node or the second node to the pad for conducting the first internal signal or the second internal signal to the probe,
   wherein the workstation analyzes either the first internal signal or the second internal signal from the probe, thereby determining performance of the DRAM.

2. The DRAM of claim 1, comprising:
   a first switch coupled between the first node and the pad; and
   a second switch coupled between the second node and the pad,
   wherein either the first switch couples the first node to the pad, or the second switch couples the second node to the pad.

3. The DRAM of claim 2, wherein the first switch has a same circuit structure as the second switch.

4. The DRAM of claim 3, wherein the first switch has same component parameters as the second switch.

5. The DRAM of claim 1, wherein the DRAM is free of a micro pad.

6. The DRAM of claim 1, wherein the second internal signal at the second node would otherwise be eligible to being tested by the probe only if a passivation layer of the DRAM was destroyed.

7. The DRAM of claim 1, further comprising:
   a third node configured to conduct a third internal signal generated by another internal device of the DRAM, wherein the third node is not connected to the pad.

8. The DRAM of claim 1, further comprising:
   a third node configured to conduct a third internal signal generated by another internal device of the DRAM.

9. A method of designing a dynamic random access memory (DRAM), the method comprising:
   providing a first node configured for conducting a first internal signal;
   providing a second node configured for conducting a second internal signal;
   providing a pad configured for receiving one of the first internal signal and the second internal signal, wherein a probe electrically coupled to the workstation contacts the pad for receiving the first internal signal or the second internal signal; and
   providing at least one switch configured for connecting either the first node or the second node to the pad for conducting the first internal signal or the second internal signal to the probe, wherein the workstation analyzes one of the first internal signal and the second internal signal form the probe, thereby determining performance of the DRAM.

10. The method of claim 9, further comprising:
providing a first switch coupled between the first node and the pad; and
providing a second switch coupled between the second node and the pad,
wherein either the first switch couples the first node to the pad, or the second switch couples the second node to the pad.

11. The method of claim 10, wherein the method does not include providing a micro pad.

12. The method of claim 9, further comprising:
providing a third node configured for conducting a third internal signal generated by another internal device of the DRAM, wherein the third node is not connected to the pad.

13. The method of claim 9, further comprising:
providing a third node configured for conducting a third internal signal generated by another internal device of the DRAM.

\* \* \* \* \*